(12) United States Patent
Tanaka

(10) Patent No.: US 10,425,605 B2
(45) Date of Patent: Sep. 24, 2019

(54) IMAGE SENSOR AND IMAGE CAPTURING APPARATUS

(71) Applicant: CANON KABUSHIKI KAISHA, Tokyo (JP)

(72) Inventor: Masanori Tanaka, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/860,045

(22) Filed: Jan. 2, 2018

(65) Prior Publication Data

US 2018/0191981 A1 Jul. 5, 2018

(30) Foreign Application Priority Data

Jan. 5, 2017 (JP) ................................. 2017-000710

(51) Int. Cl.
*H04N 5/378* (2011.01)
*H04N 5/357* (2011.01)
(Continued)

(52) U.S. Cl.
CPC ....... *H04N 5/378* (2013.01); *H01L 27/14641* (2013.01); *H04N 5/357* (2013.01); *H04N 5/374* (2013.01)

(58) Field of Classification Search
CPC ........ H04N 5/378; H04N 5/374; H04N 5/357; H01L 27/14641
See application file for complete search history.

(56) References Cited

U.S. PATENT DOCUMENTS

2004/0051802 A1* 3/2004 Krymski .............. H04N 3/1568
348/308
2005/0285958 A1* 12/2005 Matsuda ................ H04N 5/347
348/300
(Continued)

FOREIGN PATENT DOCUMENTS

JP 2008-147771 A 6/2008
JP 2010-263526 A 11/2010
(Continued)

OTHER PUBLICATIONS

The above foreign patent documents were cited in the Nov. 6, 2018 Japanese Office Action, a copy of which is enclosed without an English Translation, that issued in Japanese Patent Application No. 2017000710.

(Continued)

*Primary Examiner* — Abdelaaziz Tissire
(74) *Attorney, Agent, or Firm* — Cowan, Liebowitz & Latman, P.C.

(57) ABSTRACT

An image sensor comprising: a pixel array in which a plurality of unit pixels are arranged in a matrix; a plurality of signal output lines provided for each column of the pixel array; a signal readout circuit provided for each column of the pixel array; and a control circuit for controlling a signal from the unit pixel of each column in a first row to be output to any of the signal output lines, and controlling the signal output to the any of the signal output lines to be input to the signal readout circuit. The control circuit controls, for each column, a signal from the unit pixel in a second row to be output to another of the signal lines while the signal output to the any of the signal output lines is being input to the signal readout circuit.

9 Claims, 11 Drawing Sheets

(51) Int. Cl.
*H04N 5/374* (2011.01)
*H01L 27/146* (2006.01)

(56) References Cited

U.S. PATENT DOCUMENTS

| | | | | |
|---|---|---|---|---|
| 2007/0229686 | A1* | 10/2007 | Hiyama | H04N 5/3456 348/294 |
| 2010/0271523 | A1* | 10/2010 | Hara | H04N 5/367 348/302 |
| 2012/0049042 | A1* | 3/2012 | Lim | H04N 5/3575 250/208.1 |
| 2012/0199723 | A1* | 8/2012 | Egawa | H04N 5/3598 250/208.1 |
| 2012/0307120 | A1* | 12/2012 | Ito | H04N 5/341 348/302 |
| 2014/0160334 | A1* | 6/2014 | Wakabayashi | H04N 5/343 348/308 |
| 2015/0181140 | A1* | 6/2015 | Onishi | H04N 5/361 348/243 |
| 2015/0237247 | A1* | 8/2015 | Hara | H04N 5/2353 348/362 |
| 2017/0201702 | A1* | 7/2017 | Niwa | H01L 27/14612 |
| 2018/0270438 | A1* | 9/2018 | Niwa | H01L 27/14612 |
| 2019/0028661 | A1* | 1/2019 | Nikai | H04N 5/341 |

FOREIGN PATENT DOCUMENTS

| | | |
|---|---|---|
| JP | 2012-165044 A | 8/2012 |
| JP | 2012253741 A | 12/2012 |
| JP | 5219481 B | 6/2013 |
| JP | 2016131326 A | 7/2016 |

OTHER PUBLICATIONS

The above foreign patent documents were cited in the May 14, 2019 Japanese Office Action, a copy of which is enclosed without an English Translation, that issued in Japanese Patent Application No. 2017000710.

* cited by examiner

IMAGE SENSOR AND IMAGE CAPTURING APPARATUS

BACKGROUND OF THE INVENTION

Field of the Invention

The present invention relates to an image sensor and an image capturing apparatus.

Description of the Related Art

In recent years, the need for moving images with high resolution and high frame rate has increased, and therefore higher speed signal readout techniques are demanded for an image capturing apparatus using CMOS sensors. Japanese Patent No. 5219481 focuses on parasitic capacitances of wires used as signal output lines for transmitting signals output from pixels to column readout circuits, and introduces a method for reducing the parasitic capacitances of the signal output lines by changing the lengths of the wires. With this method, by reducing the settling time of the signal output lines, high speed signal readout is realized.

However, the method of shortening the settling time by reducing the parasitic capacitance of wires causes increase in response to power supply fluctuations and external noise at the same time, and there is concern that signal noise may worsen.

SUMMARY OF THE INVENTION

The present invention has been made in consideration of the above situation, and increases signal readout speed while suppressing an increase in signal noise.

According to the present invention, provided is an image sensor comprising: a pixel array in which a plurality of unit pixels are arranged in a matrix; a plurality of signal output lines provided for each column of the pixel array; a signal readout circuit provided for each column of the pixel array; and a control circuit which controls a signal from the unit pixel of each column in a selected first row to be output to any of the plurality of signal output lines, and controls the signal output to the any of the plurality of signal output lines to be input to the signal readout circuit, wherein the control circuit controls, for each column, a signal from the unit pixel in a second row that is different from the first row to be output to another of the plurality of signal lines while the signal output to the any of the plurality of signal output lines is being input to the signal readout circuit.

Further, according to the present invention, provided is an image capturing apparatus comprising: an image sensor including: a pixel array in which a plurality of unit pixels are arranged in a matrix; a plurality of signal output lines provided for each column of the pixel array; a signal readout circuit provided for each column of the pixel array; and a control circuit which controls a signal from the unit pixel of each column in a selected first row to be output to any of the plurality of signal output lines, and controls the signal output to the any of the plurality of signal output lines to be input to the signal readout circuit; and a processing unit that processes a signal output from the image sensor, wherein the control circuit controls, for each column, a signal from the unit pixel in a second row that is different from the first row to be output to another of the plurality of signal lines while the signal output to the any of the plurality of signal output lines is being input to the signal readout circuit.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

First Embodiment

Figure 1:
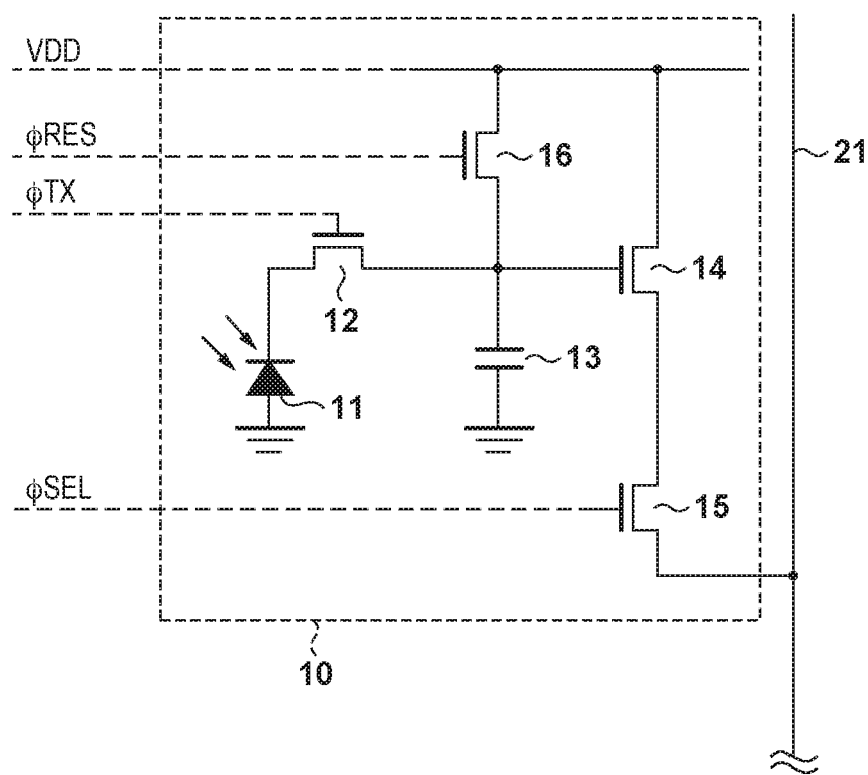
FIG. 1 is an equivalent circuit diagram showing a configuration of a unit pixel according to a first embodiment of the present invention.

FIG. 1 is a diagram showing a circuit configuration of a unit pixel 10 according to a first embodiment. The unit pixel 10 includes a photodiode (PD) 11, a transfer switch 12, a floating diffusion portion (FD) 13, an amplification MOS amplifier 14, a row selection switch 15, and a reset switch 16.

The PD 11 generates electric charges corresponding to light incident through an imaging optical system (not shown). The transfer switch 12 is driven by a transfer pulse φTX input to its gate terminal, and transfers the charge generated at the PD 11 to the FD 13. The FD 13 functions as a charge voltage converting unit that temporarily accumulates the charge and converts the accumulated charge into a voltage signal. The amplification MOS amplifier 14 functions as a source follower together with a constant current circuit 22 to be described later, and a signal whose charge voltage is converted by the FD 13 is input to the gate thereof.

The row selection switch 15 is driven by a row selection pulse φSEL input to its gate, its drain is connected to the amplification MOS amplifier 14, and its source is connected to a vertical output line 21 (signal output line). The row selection switch 15 in which the row selection pulse φSEL is at the active level (high level) enters a conducting state, and the source of the amplification MOS amplifier 14 corresponding thereto is connected to the vertical output line 21. The vertical output line 21 is shared by a plurality of unit pixels 10 and connected to a signal readout circuit 20 to be described later.

The reset switch 16 has its drain connected to the power supply line VDD and is driven by a reset pulse φRES input to its gate to remove the charge accumulated in the FD 13. Also, by turning ON the reset switch 16 and the transfer switch 12 at the same time, the PD 11 can be reset. It should be noted that the amplification MOS amplifier 14 outputs a reset signal to the vertical output line 21 when the FD 13 is reset by the reset pulse φRES. In addition, when the charge generated in the PD 11 is transferred by the transfer pulse φTX, a transferred signal including a signal obtained by the photoelectric conversion of the PD 11 is output.

Figure 2:
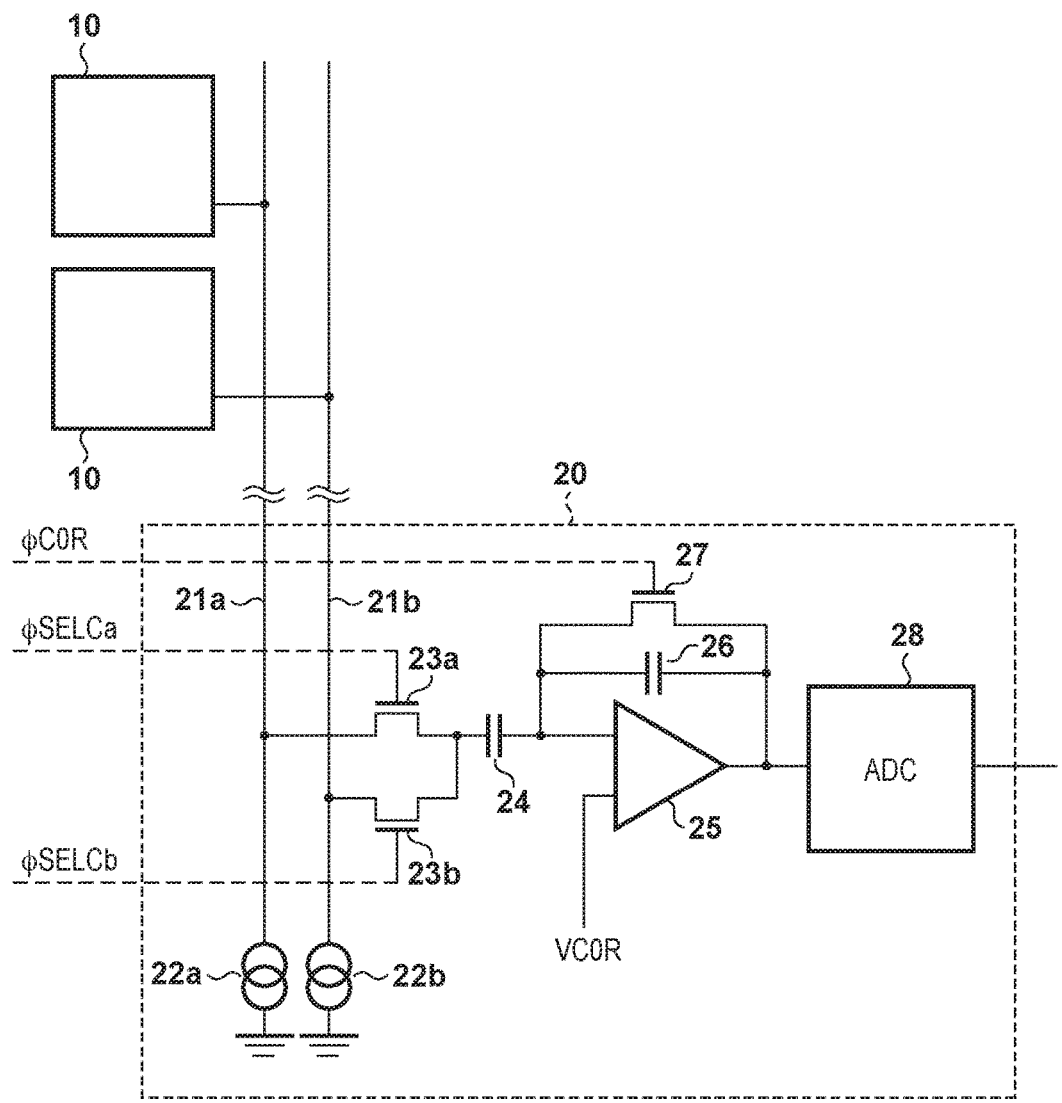
FIG. 2 is an equivalent circuit diagram showing a configuration of a signal readout circuit according to the first embodiment.

FIG. 2 shows the configuration of the signal readout circuit 20 of the first embodiment. The signal readout circuit 20 performs signal readout with the signals of the two vertical output lines 21 as inputs. The constant current circuit 22 is connected to each of the two vertical output lines 21 and functions as a source follower together with the amplification MOS amplifier 14. At this time, the potential of a signal in the FD 13 is reflected in the potential of the vertical output line 21.

In the following description, the two vertical output lines 21 are distinguished from each other and are referred to as the vertical output lines 21a and 21b, and the two constant current circuits 22 connected to the vertical output lines 21a and 21b, respectively, are distinguished from each other, and are referred to as the constant current circuits 22a and 22b.

The signal readout circuit 20 includes input changeover switches 23a and 23b, a clamp capacitor 24, a differential amplifier 25, a gain capacitor 26, a clamp switch 27, and an AD conversion circuit (ADC) 28.

The input changeover switches 23a and 23b are driven by vertical output line switching pulses φSELCa and φSELCb input to the respective gates to switch connection/disconnection between the corresponding vertical output lines 21a and 21b and the clamp capacitor 24. As a result, the clamp capacitor 24 can be selectively connected to any of the vertical output lines 21a and 21b. The differential amplifier 25, the clamp capacitor 24, and the gain capacitor 26 operate as analog gain amplifiers by being connected as shown in the figure, and output analog signals to the AD conversion circuit 28.

The clamp switch 27 is driven by a clamp pulse φC0R input to its gate to short between the output terminal and one of the input terminals of the differential amplifier 25. A reference voltage VC0R is input to the other input terminal of the differential amplifier 25, and when the clamp switch 27 becomes an active level (high level), the output terminal and the input terminal of the differential amplifier 25 are reset to the reference voltage VC0R.

The AD conversion circuit 28 is connected to the output terminal of the differential amplifier 25, and converts the analog signal outputted from the differential amplifier 25 into a digital signal and outputs it. In the first embodiment, the circuit that operates as an analog gain amplifier is provided in upstream of the AD conversion circuit 28. However, this circuit may be omitted and the vertical output lines 21a and 21b and the AD conversion circuit 28 may be connected via the input changeover switches 23a and 23b.

Figure 3:
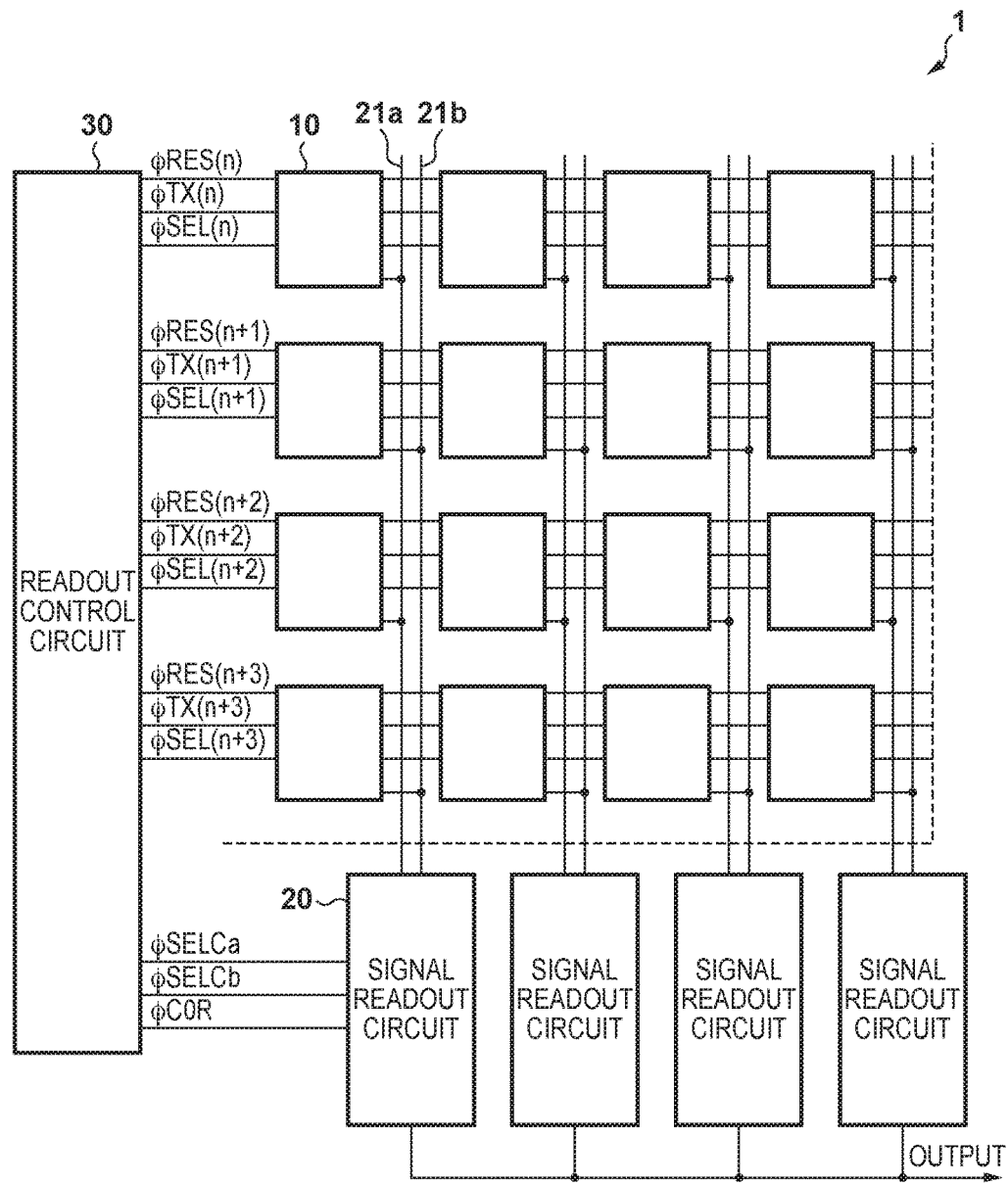
FIG. 3 is a block diagram showing a configuration of part of an image sensor according to the first embodiment.

FIG. 3 is a block diagram showing a configuration of part of an image sensor 1 in the first embodiment. The image sensor 1 includes a pixel array 100 in which the unit pixels 10 shown in FIG. 1 are arranged in a matrix, a plurality of signal readout circuits 20 each provided for each column of the pixel array 100, and a readout control circuit 30 for controlling signal readout on a row-by-row basis. In the example shown in FIG. 3, the unit pixels 10 located in the odd rows are connected to the vertical output lines 21a, and the unit pixels 10 located in the even rows are connected to the vertical output lines 21b.

The readout control circuit 30 supplies the row selection pulse φSEL, the reset pulse φRES, and the transfer pulse φTX to one of the unit pixel rows to control the signal output operation to the vertical output lines 21a and 21b. In addition, the readout control circuit 30 supplies the vertical output line switching pulses φSELCa and φSELCb and clamp pulse φC0R to the signal readout circuits 20 to control the signal readout operation of the vertical output lines 21a and 21b. In the description of FIG. 3 and the subsequent description, the "reset pulse φRES for the n-th row" is referred to as "reset pulse φRES(n)" with the suffix n. This also applies to the transfer pulse φTX and the row selection pulse φSEL.

Also, in the first embodiment, a configuration in which the signal readout circuit 20 is shared by pixel units 10 in each column of the pixel array 100 is explained, but the gist of the present invention is not limited thereto, and various configurations can be adopted. For example, in a stacked type image sensor having a first substrate and a second substrate connected via a bump junction or the like, the pixel array 100 is provided on the first substrate, and a plurality of the signal readout circuits 20 may be arranged on the second substrate so that each signal readout circuit 20 is provided for each unit pixel 10 or for each group of unit pixels 10.

Figure 4:
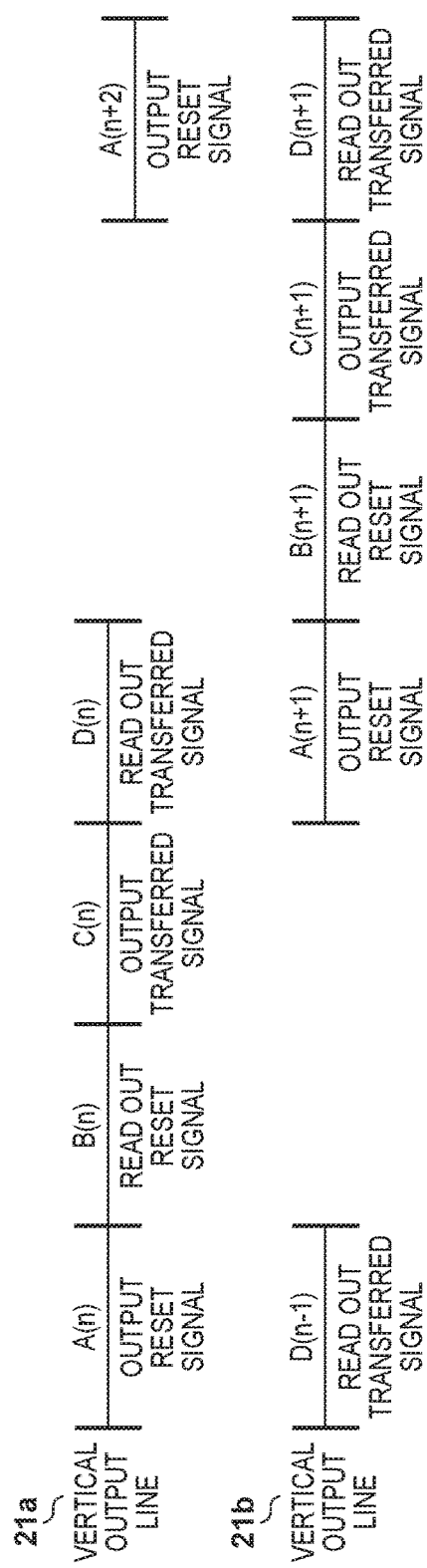
FIG. 4 is a diagram for explaining an outline of a signal readout operation according to the first embodiment.

Before explaining in detail the operation of reading out the signal of the unit pixel 10, the outline of the operation in the first embodiment will be described. FIG. 4 is a diagram schematically showing a flow of a signal output operation executed by the unit pixel 10 and a signal readout operation executed by the signal readout circuit 20 under control of the readout control circuit 30. To read out the signal of the unit pixel 10, the following four operations A to D are roughly performed.

Operation A: The readout control circuit 30 turns on the reset switch 16 of the unit pixel 10 and causes a signal output operation to be executed, wherein the signal output operation is to output a reset signal to either of the vertical output lines 21a and 21b to which the unit pixel 10 is connected. Then, the reset signal outputted to one of the vertical output lines 21a and 21b is waited to settle.

Operation B: The readout control circuit 30 causes the signal readout circuit 20 to execute a signal readout operation, wherein the signal readout operation is to read out the reset signal output to one of the vertical output lines 21a and 21b to the signal readout circuit 20.

Operation C: The readout control circuit 30 turns on the transfer switch 12 of the unit pixel 10 and causes a signal output operation to be executed, wherein the signal output operation is to output a transferred signal from the PD 11 to either of the vertical output lines 21a and 21b to which the unit pixel 10 is connected. Then, the transferred signal output to one of the vertical output lines 21a and 21b is waited to settle.

Operation D: The readout control circuit 30 causes the signal readout circuit 20 to execute a signal readout operation, wherein the signal readout operation is to read out the transferred signal output to one of the vertical output lines 21a and 21b via the signal readout circuit 20.

The readout control circuit 30 executes the operation A for the n-th row and outputs a reset signal to the vertical output line 21a. At this time, as will be described in detail later, the operation D is executed for the (n−1)-th row. Next, the operation B is executed for the n-th row, and the reset signal output to the vertical output line 21a is read out to the signal readout circuit 20. Subsequently, the operation C is executed, and a transferred signal from the PD 11 in the n-th row is outputted to the vertical output line 21a. In the next operation D, the transferred signal of the n-th row output to the vertical output line 21a is read out via the signal readout circuit 20.

Here, in the operation A, the vertical output line 21a is used, but the signal readout circuit 20 is not used. Therefore, in the first embodiment, while performing the operation D, the operation A is executed for another row of unit pixels using the other vertical output line 21b.

Here, the readout control circuit 30 controls the signal readout circuit 20 to perform the operation D for the n-th row, and also controls the unit pixel 10 to execute the operation A for the (n+1)-th row. In other words, the readout control circuit 30 concurrently controls to perform the operation D of reading out the transferred signal from the unit pixel 10 of the n-th row and the operation A of outputting the reset signal of the (n+1)-th row to the vertical output line 21b. In this way, after the operation D of reading out the transferred signal from the unit pixel 10 of the n-th row is completed, the operation B of reading out the reset signal of the (n+1)-th row that has been output to the vertical output line 21b can be performed without waiting for a time of the operation A of outputting the reset signal to the vertical output line 21b being performed, and it is possible to increase the readout speed.

Thereafter, the operation B of reading out the reset signal of the (n+1)-th row and the operation C of outputting the transferred signal of the (n+1)-th row to the vertical output line 21a are performed. Thereafter, similarly, the readout control circuit 30 controls to concurrently perform the operation D of reading out the transferred signal of the (n+1)-th row and the operation A of outputting the reset signal of the (n+2)-th row to the vertical output line 21a.

It should be noted that, in the above example, the case where the operation D for the n-th row and the operation A for the (n+1)-th row are performed in parallel has been described. However, the present invention is not limited thereto, and the operation A for the (n+1)-th row needs to be performed during a period between the operation B and the operation D for the n-th row in parallel. Regardless of the operation A being performed at any of the above timings, the operation B for the (n+1)-th row is to be performed after waiting for the completion of the operation D for the n-th row.

Figure 5:
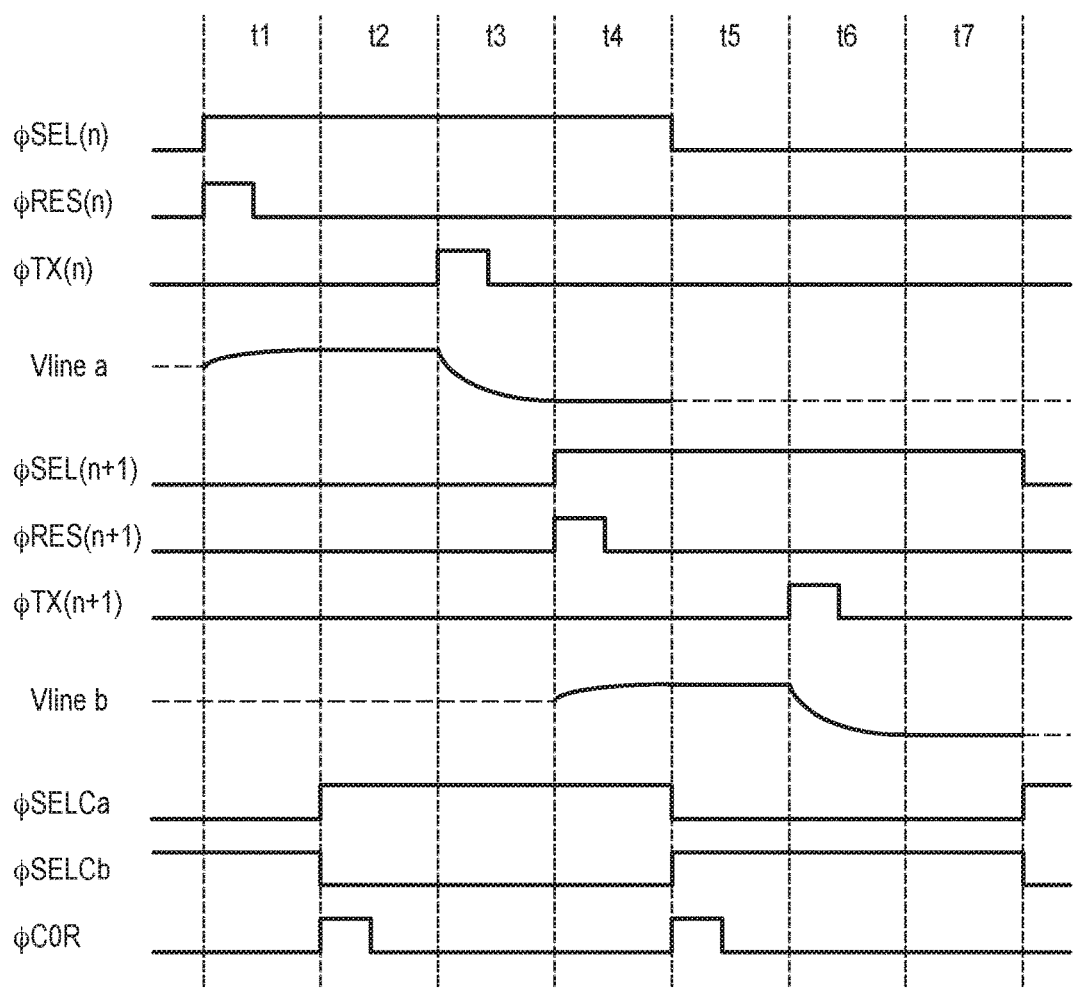
FIG. 5 is a timing chart showing the signal readout operation according to the first embodiment.

Next, a specific operation performed by the readout control circuit 30 in the first embodiment will be described in detail using a timing chart. FIG. 5 is a timing chart showing the signal output operation and the signal readout operation performed by the readout control circuit 30 in the first embodiment.

In a period t1, the row selection pulse φSEL(n) becomes "H", and the unit pixel 10 in the n-th row starts outputting a signal to the corresponding vertical output line 21a. At the same time, the reset pulse φRES(n) becomes "H" to eliminate the unnecessary charge of the FD 13, and it becomes "L" after resetting the potential of the FD 13. At this time, the unit pixel 10 of the n-th row outputs a reset signal to the vertical output line 21a. The reset signal is reflected on the vertical output line 21a over the settling time as indicated by Vline a (operation A).

In a period t2, the vertical output line switching pulse φSELCa becomes "H" and the vertical output line switching pulse φSELCb becomes "L", so that the vertical output line 21a is selected and the signal readout circuit 20 reads out the reset signal from the vertical output line 21a. At the same time, the clamp pulse φC0R becomes "H", and the input terminal and the output terminal of the differential amplifier 25 are reset to the reference voltage VC0R. Thereafter, when the clamp pulse φC0R becomes "L", the clamp capacitor 24 clamps (holds) the reset signal of the n-th row to the reference voltage VC0R (operation B).

In a period t3, the transfer pulse φTX(n) becomes "H", and the charge accumulated in the PD 11 in the n-th row is transferred to the FD 13. Thereafter, the transfer pulse φTX(n) becomes "L", and the unit pixel 10 in the n-th row outputs the transferred signal to the vertical output line 21a. The transferred signal is reflected on the vertical output line 21a over the settling time as indicated by Vline a (operation C).

In a period t4, the signal readout circuit 20 reads the transferred signal of the n-th row from the vertical output line 21a. The differential amplifier 25 performs signal amplification according to the signal gain determined by the capacitance ratio of the clamp capacitor 24 and the gain capacitor 26, and outputs the result to the AD conversion circuit 28. Strictly speaking, since the reset signal is clamped to the reference voltage VC0R by the clamp capacitor 24, the difference between the reset signal and the transferred signal is amplified. The AD conversion circuit 28 converts the signal input from the differential amplifier 25 into a digital signal and outputs it to the outside of the image sensor 1 (operation D).

In the same period t4, the row selection pulse φSEL(n+1) becomes "H", and the unit pixel 10 in the (n+1)-th row starts outputting a signal to the corresponding vertical output line 21b. At the same time, the reset pulse φRES(n+1) becomes "H" to eliminate the unnecessary charge of the FD 13, and it becomes "L" after resetting the potential of the FD 13. At this time, the unit pixel 10 in the (n+1)-th row outputs a reset signal to the vertical output line 21b. The reset signal is reflected on the vertical output line 21b over a settling time as indicated by Vline b (operation A).

In a period t5, the row selection pulse φSEL(n) becomes "L", and the unit pixel 10 in the n-th row and the vertical output line 21a are disconnected. In addition, the vertical output line switching pulse φSELCa becomes "L" and the vertical output line switching pulse φSELCb becomes "H", so that the vertical output line 21b is selected. As a result, the signal readout circuit 20 reads out the reset signal of the (n+1)-th row from the settled vertical output line 21b. At the same time, the clamp pulse φC0R becomes "H", and the input terminal and the output terminal of the differential amplifier 25 are reset to the reference voltage VC0R. Thereafter, when the clamp pulse φC0R becomes "L", the clamp capacitor 24 clamps (holds) the reset signal of the (n+1)-th row to the reference voltage VC0R (operation B).

In a period t6, the transfer pulse φTX(n+1) becomes "H", and the charge accumulated in the PD 11 is transferred to the FD 13. Thereafter, the transfer pulse φTX(n+1) becomes "L", and the unit pixel 10 in the (n+1)-th row outputs the transferred signal to the vertical output line 21b. As indicated by Vline b, the transferred signal is reflected on the vertical output line 21b over the settling time (operation C).

In a period t7, the signal readout circuit 20 reads out the transferred signal of the (n+1)-th row from the vertical output line 21b. The differential amplifier 25 performs signal amplification according to the signal gain determined by the capacitance ratio of the clamp capacitor 24 and the gain capacitor 26, and outputs the result to the AD conversion circuit 28. The AD conversion circuit 28 converts the signal input from the differential amplifier 25 into a digital signal and outputs it to the outside of the image sensor 1 (operation D).

Although it is not shown, in the same period t7, the row selection pulse ϕSEL(n+2) becomes "H", and the unit pixel 10 in the n+2-th row starts outputting a signal to the corresponding vertical output line 21a. At the same time, the reset pulse ϕRES(n+2) becomes "H" to eliminate the unnecessary charge of the FD 13, and it becomes "L" after resetting the potential of the FD 13. At this time, the unit pixel 10 in the (n+2)-th row outputs a reset signal to the vertical output line 21a. The reset signal is reflected on the vertical output line 21a over the settling time (operation A). Thereafter, by repeating the same operation as from the period t2, the signals of the unit pixels 10 are sequentially read out.

According to the first embodiment as described above, each of the signal readout circuits 20 has a configuration that selects one of a plurality of the vertical output lines 21, and as in the period t4, executes a readout operation of the transferred signal of the n-th row in the vertical output line 21a. In parallel with this readout operation, the reset signal output operation to the vertical output line 21b is executed for the unit pixel 10 in the (n+1)-th row, and the reset signal is settled. In the case where there is only one vertical output line 21 for each column, a period corresponding to periods t1 to t4 is required for reading out signals of one row. By contrast, in the present embodiment, a setting time of the reset signal, that is, a time corresponding to the period t1 can be shortened, which makes it possible to increase readout speed.

In the example described above, the case where the two vertical output lines 21a and 21b are wired for each column has been described, however the present invention is not limited to this, and three or more vertical output lines may be arranged for each column.

Second Embodiment

Figure 6:
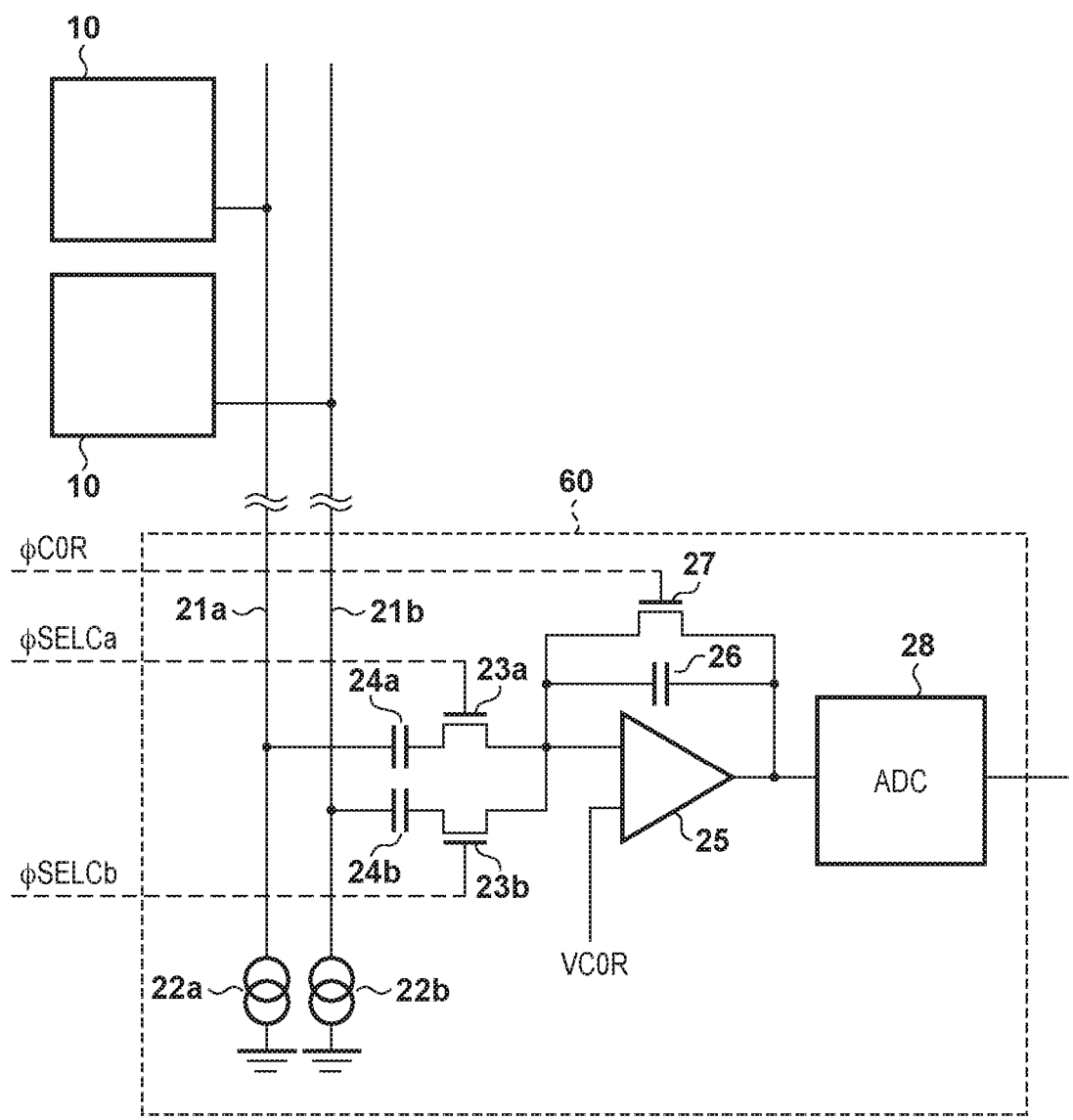
FIG. 6 is an equivalent circuit diagram showing a configuration of a signal readout circuit according to a second embodiment.

Next, a second embodiment of the present invention will be described. FIG. 6 is a circuit diagram showing the configuration of a signal readout circuit 60 of the second embodiment, which can be used in place of the signal readout circuit 20 in the first embodiment. In the signal readout circuit 60 of the second embodiment, the same reference numerals are given to the same configurations as those of the signal readout circuit 20 of the first embodiment, and a description thereof will be omitted.

The signal readout circuit 60 of the second embodiment has two clamp capacitors 24a and 24b which are provided between the vertical output lines 21a and 21b and the input changeover switches 23a and 23b, respectively. In the second embodiment, the circuit which operates as an analog gain amplifier is provided in the preceding stage of the AD conversion circuit 28. However, this circuit may be omitted, and the clamp capacitors 24a and 24b may be connected to the AD conversion circuit 28 via the input changeover switches 23a and 23b.

Figure 7:
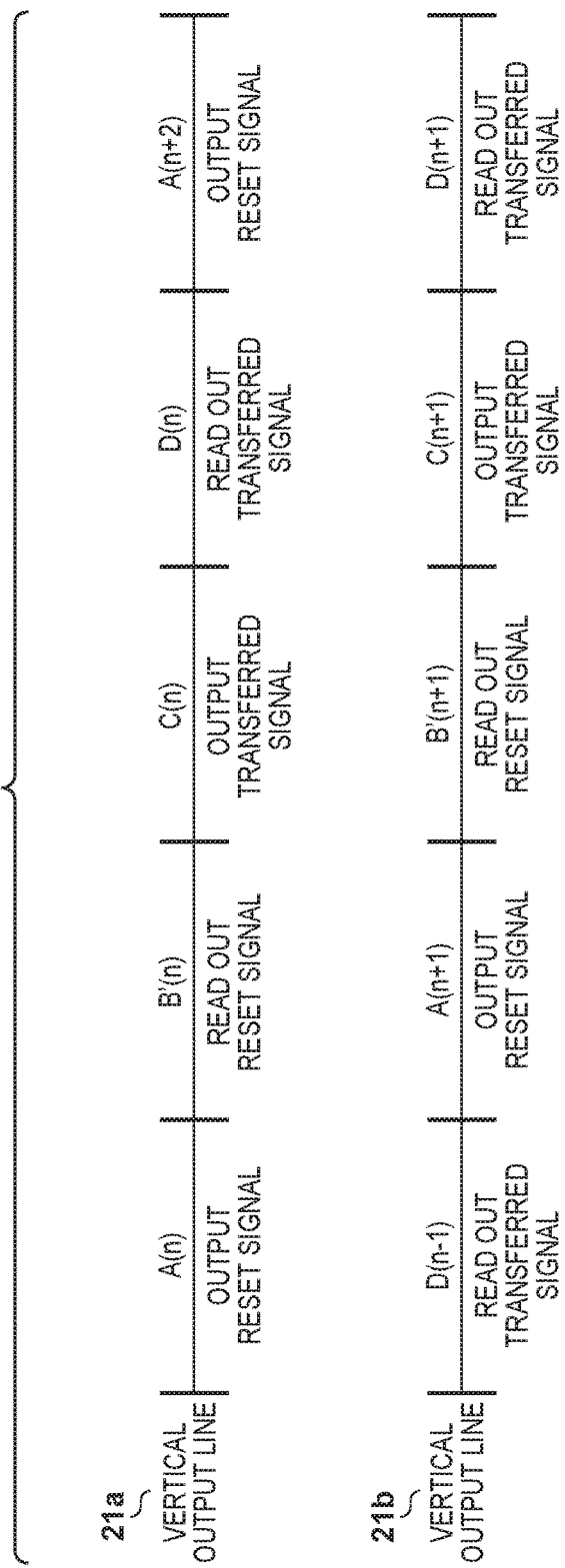
FIG. 7 is a diagram for explaining an outline of the signal readout operation according to the second embodiment.

Before explaining in detail the operation of reading out the signal of the unit pixel 10, the outline of the operation in the second embodiment will be described. FIG. 7 is a diagram schematically showing a flow of a signal output operation executed by the unit pixel 10 and a signal readout operation executed by the signal readout circuit 60 under control of the readout control circuit 30. To read out the signal of the unit pixel 10, the following four operations A to D are roughly performed. Of the four operations, since the operation B of the first embodiment is different in the second embodiment, the operation B' is set.

Operation A: The readout control circuit 30 turns on the reset switch 16 of the unit pixel 10 and causes a signal output operation to be executed, wherein the signal output operation is to output a reset signal to either of the vertical output lines 21a and 21b to which the unit pixel 10 is connected. Then, the reset signal outputted to one of the vertical output lines 21a and 21b is waited to settle.

Operation B': The readout control circuit 30 causes the signal readout circuit 60 to execute a signal readout operation, wherein the signal readout operation is to clamp the reset signal output to one of the vertical output lines 21a and 21b to one of the clamp capacitors 24a or 24b of the signal readout circuit 60.

Operation C: The readout control circuit 30 turns on the transfer switch 12 of the unit pixel 10 and causes a signal output operation to be executed, wherein the signal output operation is to output a transferred signal from the PD 11 to either of the vertical output lines 21a and 21b to which the unit pixel 10 is connected. Then, the transferred signal output to one of the vertical output lines 21a and 21b is waited to settle.

Operation D: The readout control circuit 30 causes the signal readout circuit 60 to execute a signal readout operation, wherein the signal readout operation is to read out the transferred signal output to one of the vertical output lines 21a and 21b via the signal readout circuit 60.

In the first embodiment, the clamp capacitor 24 of the signal readout circuit 20 is occupied by the clamped reset signal from the time when the clamp capacitor 24 clamps the reset signal read out in the operation B until the transferred signal is read out in the operation D.

On the other hand, in the second embodiment, the two clamp capacitors 24a and 24b are provided so as to correspond to the vertical output lines 21a and 21b, respectively, and the signal readout circuit 60 can switch between the two clamp capacitors 24a and 24b. As a result, during the operation C, the signal readout circuit 60 can use one of the clamp capacitors 24a and 24b even when the other of the clamp capacitors 24a and 24b is used to clamp a signal. That is, in the operation C, the signal readout circuit 60 is not occupied, and the operation B' that uses the signal readout circuit 60 can be performed in parallel.

Therefore, the flow of the operation by the readout control circuit 30 can be summarized as follows. First, in parallel with the execution of the operation A for the n-th row, the signal readout circuit 60 is caused to select the vertical output line 21b via the clamp capacitor 24b, and the operation D is performed for the (n−1)-th row. Next, by causing the signal readout circuit 60 to select the vertical output line 21a via the clamp capacitor 24a, the operation A is executed for the (n+1)-th row in parallel with the execution of the operation B' for the n-th row.

Continuously, in parallel with the execution of the operation C for the n-th row, by causing the signal readout circuit 60 to select the vertical output line 21b via the clamp capacitor 24b, the operation B' is performed for the (n+1)-th row. Next, the readout control circuit 30 causes the signal readout circuit 60 to select the vertical output line 21a via the clamp capacitor 24a, the operation C is executed for the (n+1)-th row in parallel with the execution of the operation D for the n-th row.

Thereafter, the vertical output line 21b is selected via the clamp capacitor 24b for the (n+1)-th row, and the operation A is executed for the (n+2)-th row in parallel with the operation D executed for the (n+1)-th row. The above-described operation is repeated.

As described above, it is possible to execute the operations A and C that include signal settling in the vertical output lines 21a and 21b in parallel with the operations B' and D that use the signal readout circuit 60, and it is possible to further increase the readout speed.

Figure 8:
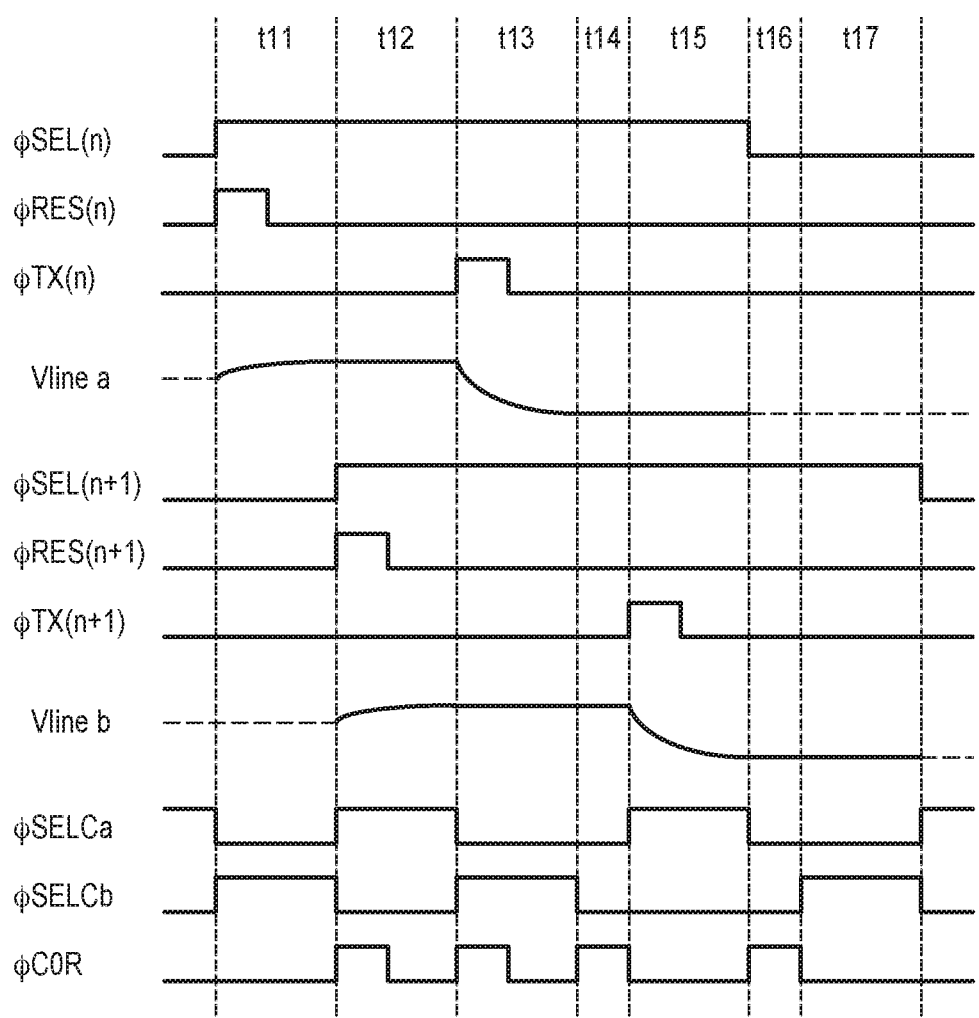
FIG. 8 is a timing chart showing the signal readout operation according to the second embodiment.

Next, a specific operation performed by the readout control circuit 30 in the second embodiment will be described in detail using a timing chart. FIG. 8 is a timing chart showing the signal output operation and the signal readout operation performed by the readout control circuit 30 in the second embodiment.

In a period t11, the row selection pulse φSEL(n) becomes "H", and the unit pixel 10 in the n-th row starts outputting a signal to the corresponding vertical output line 21a. At the same time, the reset pulse φRES(n) becomes "H" to eliminate the unnecessary charge of the FD 13, and it becomes "L" after resetting the potential of the FD 13. At this time, the unit pixel 10 of the n-th row outputs a reset signal to the vertical output line 21a. The reset signal is reflected on the vertical output line 21a over the settling time as indicated by Vline a (operation A).

In a period t12, the vertical output line switching pulse φSELCa becomes "H" and the vertical output line switching pulse φSELCb becomes "L", thereby the differential amplifier 25 is connected to the vertical output line 21a via the clamp capacitor 24a. At this time, the signal readout circuit 60 reads out the reset signal of the n-th row from the vertical output line 21a. At the same time, the clamp pulse φC0R becomes "H", and the input terminal and the output terminal of the differential amplifier 25 are reset to the reference voltage VC0R. Thereafter, when the clamp pulse φC0R becomes "L", the clamp capacitor 24a clamps the reset signal of the n-th row to the reference voltage VC0R (operation B').

In the same period t12, the row selection pulse φSEL(n+1) becomes "H", and the unit pixel 10 in the (n+1)-th row starts outputting a signal to the corresponding vertical output line 21b. At the same time, the reset pulse φRES(n+1) becomes "H" to eliminate the unnecessary charge of the FD 13, and it becomes "L" after resetting the potential of the FD 13. At this time, the unit pixel 10 in the (n+1)-th row outputs a reset signal to the vertical output line 21b. The reset signal is reflected on the vertical output line 21b over a settling time as indicated by Vline b (operation A).

In the period t13, the vertical output line switching pulse φSELCa becomes "L" and the vertical output line switching pulse φSELCb becomes "H". As a result, the clamp capacitor 24a is disconnected from the differential amplifier 25 with the reset signal of the n-th row clamped to the reference voltage VC0R, and the clamp capacitor 24b is connected to the differential amplifier 25. At this time, the signal readout circuit 60 reads out the reset signal of the (n+1)-th row from the vertical output line 21b. At the same time, the clamp pulse φC0R becomes "H", and the input terminal and the output terminal of the differential amplifier 25 are reset to the reference voltage VC0R. Thereafter, when the clamp pulse φC0R becomes "L", the clamp capacitor 24b clamps the reset signal of the (n+1)-th row to the reference voltage VC0R (operation B').

Further, in the same period t13, the transfer pulse φTX(n) becomes "H", and the charge accumulated in the PD 11 in the n-th row is transferred to the FD 13. Thereafter, the transfer pulse φTX(n) becomes "L", and the unit pixel 10 in the n-th row outputs the transferred signal to the vertical output line 21a. As indicated by Vline a, the transferred signal is reflected on the vertical output line 21a over the settling time (operation C).

In the period t14, when the vertical output line switching pulse φSELCb becomes "L", the clamp capacitor 24b is disconnected from the differential amplifier 25 in a state where the reset signal of the (n+1)-th row is clamped to the reference voltage VC0R. At the same time, the clamp pulse φC0R becomes "H", and the input terminal and the output terminal of the differential amplifier 25 are reset to the reference voltage VC0R.

In the period t15, the clamp pulse φC0R becomes "L" and the vertical output line switching pulse φSELCa becomes "H", and the vertical output line 21a is connected to the differential amplifier 25 via the clamp capacitor 24a. By this, the signal readout circuit 60 reads the transferred signal of the n-th row from the settled vertical output line 21a. The differential amplifier 25 performs signal amplification according to the signal gain determined by the capacitance ratio of the clamp capacitor 24a and the gain capacitor 26, and outputs the result to the AD conversion circuit 28. Strictly speaking, since the reset signal is clamped to the reference voltage VC0R by the clamp capacitor 24a, the difference between the reset signal and the transferred signal is amplified. The AD conversion circuit 28 converts the signal input from the differential amplifier 25 into a digital signal and outputs it to the outside of the image sensor 1 (operation D).

Further, in the same period t15, the transfer pulse φTX (n+1) becomes "H", and the charge accumulated in the PD 11 in the (n+1)-th row is transferred to the FD 13. Thereafter, the transfer pulse φTX(n+1) becomes "L", and the unit pixel 10 in the (n+1)-th row outputs the transferred signal to the vertical output line 21b. The transferred signal is reflected on the vertical output line 21b over the settling time as indicated by Vline b (operation C).

In a period t16, the row selection pulse φSEL(n) becomes "L", and the unit pixel 10 in the n-th row and the vertical output line 21a are disconnected. In addition, the vertical output line switching pulse φSELCa becomes "L", and the clamp capacitor 24a is disconnected from the differential amplifier 25. At the same time, the clamp pulse φC0R becomes "H", and the input terminal and the output terminal of the differential amplifier 25 are reset to the reference voltage VC0R.

In the period t17, the clamp pulse φC0R becomes "L" and the vertical output line switching pulse φSELCb becomes "H", and the vertical output line 21b is connected to the differential amplifier 25 via the clamp capacitor 24b. By this, the signal readout circuit 60 reads the transferred signal of the (n+1)-th row from the settled vertical output line 21b. The differential amplifier 25 performs signal amplification according to the signal gain determined by the capacitance ratio of the clamp capacitor 24b and the gain capacitor 26, and outputs the result to the AD conversion circuit 28. The AD conversion circuit 28 converts the signal input from the differential amplifier 25 into a digital signal and outputs it to the outside of the image sensor 1 (operation D).

In the same period t17, the row selection pulse φSEL(n+2) becomes "H", and the unit pixel 10 in the (n+2)-th row starts outputting a signal to the corresponding vertical output line 21a. At the same time, the reset pulse φRES(n+2) becomes "H" to eliminate the unnecessary charge of the FD 13, and it becomes "L" after resetting the potential of the FD 13. At this time, the unit pixel 10 in the (n+2)-th row outputs a reset signal to the vertical output line 21a. The reset signal is reflected on the vertical output line 21a over a settling time. Thereafter, by repeating the same operation as from the period t12, the signals of the unit pixels 10 are sequentially read out.

According to the second embodiment as described above, each of the signal readout circuits 60 has a configuration that selects one of a plurality of the vertical output lines 21, and as in the periods t12 and t15, concurrently executes a readout operation of the vertical output line 21a and a signal output operation to the vertical output line 21b. Further, as in the periods t13 and t17, the signal readout circuits 60 concurrently execute a readout operation of the vertical output line 21b and a signal output operation to the vertical output line 21a. In this manner, it is possible to further increase readout speed.

In the example described above, the configuration that uses the two vertical output lines 21a and 21b and the clamp capacitors 24a and 24b has been described, however the present invention is not limited to this, and three or more vertical output lines and clamp capacitors may be arranged for each column.

Third Embodiment

Next, a third embodiment of the present invention will be described. In the third embodiment, a description will be given of a case where an addition readout operation is performed in which the output signals of a plurality of unit pixels are added up into one output signal. In order to distinguish it from the above-described signal readout operation, the signal readout operation shown in FIGS. 5 and 8 will be referred to as a non-addition readout operation hereinafter. The addition reading operation is effective, for example, in the case of recording a moving image which requires a high frame rate and can accept a low resolution.

Figure 9:
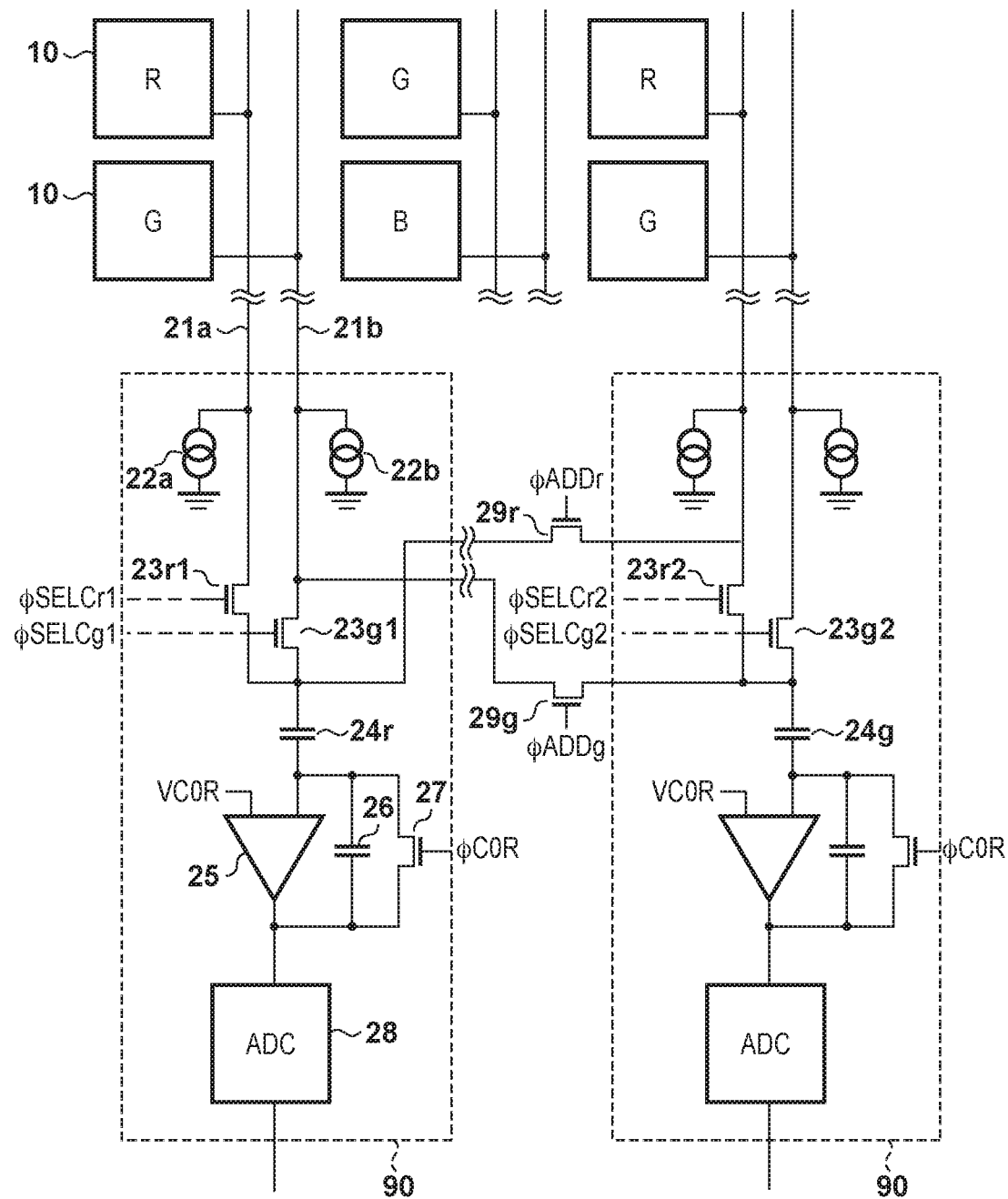
FIG. 9 is an equivalent circuit diagram showing a configuration of a signal readout circuit according to a third embodiment.

FIG. 9 is a circuit diagram showing the configuration of a signal readout circuit 90 of the third embodiment, which can be used in place of the signal readout circuit 20 in the first embodiment. FIG. 9 shows an example of a circuit configuration in which an addition switch 29 for connecting the vertical output lines 21 of different columns is provided. In FIG. 9, the same reference numerals are given to the same configurations as those shown in FIG. 2, and a description thereof will be omitted.

In the unit pixel 10, color filters of Bayer arrangement are arranged, and RG columns that consist of the unit pixels 10 having color filters of R (red) and the unit pixels 10 having color filters of G (green), and GB columns that consist of the unit pixels 10 having color filters of G and the unit pixels 10 having color filters of B (blue) are formed. The unit pixels 10 having color filters of the same color are connected to each vertical output line. More specifically, in the two adjacent RG columns, the vertical output lines to which the unit pixels 10 having the R color filters are connected are connected to a clamp capacitor 24r via an input changeover switch 23r1 and an addition switch 29r. Likewise, the adjacent vertical output lines to which the unit pixels 10 having the G color filters are connected are connected to a clamp capacitor 24g via an input changeover switch 23g2 and an addition switch 29g.

Although not shown, in the two adjacent BG columns, the vertical output lines to which the two unit pixels 10 having the B color filters are connected are connected to a clamp capacitor 24b via an input changeover switch 23b1 and an addition switch 29b via the addition switch 29b. Similarly, the vertical output lines to which the two unit pixels 10 having the G color filters are connected are connected to the clamp capacitor 24g via the input changeover switch 23g2 and the addition switch 29g.

Figure 10:
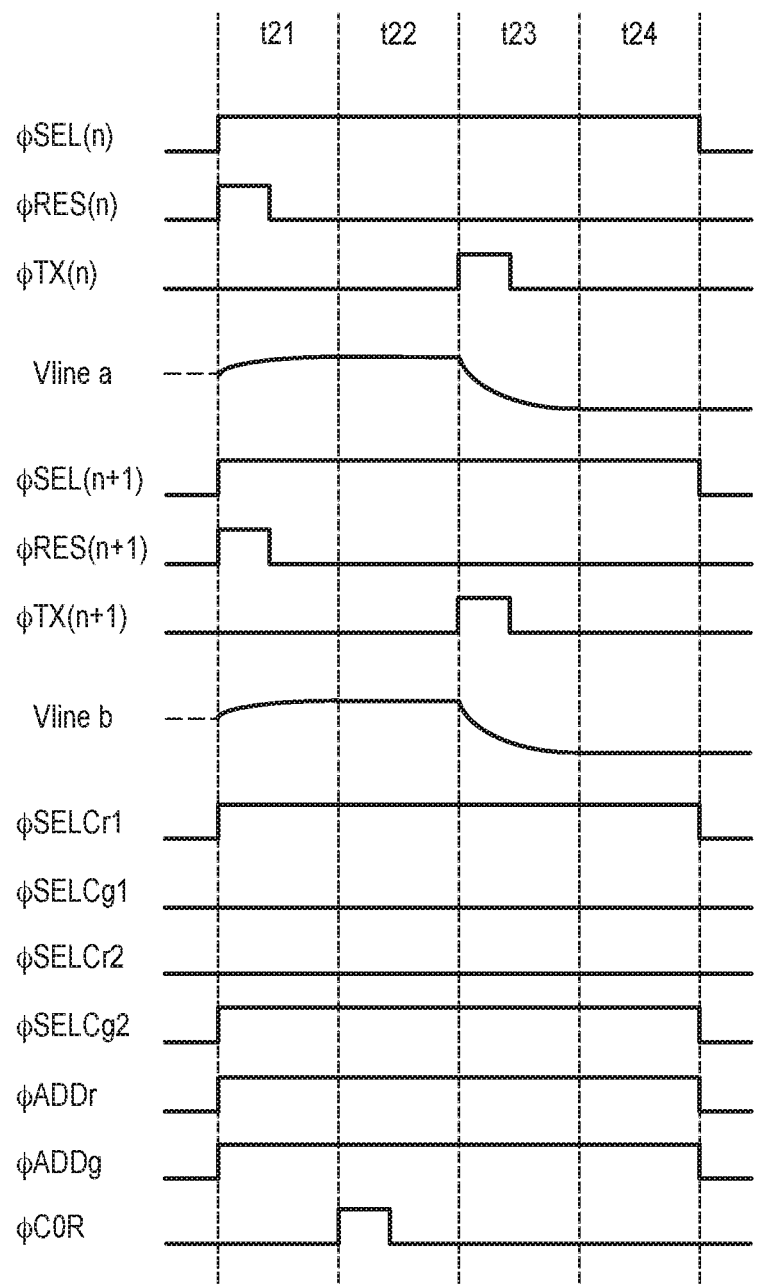
FIG. 10 is a timing chart showing addition readout operation according to the third embodiment.

FIG. 10 is a timing chart showing addition readout operation by the readout control circuit 30 in the third embodiment.

First, in the period t21, the row selection pulse φSEL(n) and the row selection pulse φSEL(n+1) become "H", and the unit pixels 10 in the n-th row and the (n+1)-th row respectively output signals to the corresponding vertical output lines 21a and 21b. Simultaneously, the reset pulses φRES(n) and φRES(n+1) become "H" to eliminate unnecessary charges of the corresponding FDs 13, and become "L" after the potential of the FDs 13 are reset. At this time, the unit pixels 10 of the n-th row and the (n+1)-th row output reset signals to the corresponding vertical output lines 21a and 21b. The reset signals are reflected on the vertical output lines 21a and 21b over the settling time as shown by Vline a and Vline b.

Further, a vertical output line switching pulse φSELCr1 and an addition switching pulse φADDr become "H", and the two vertical output lines 21a to which reset signals of the R pixels are output are connected to the clamp capacitor 24r. Similarly, a vertical output line switching pulse φSELCg2 and an addition switching pulse φADDg become "H", and the two vertical output lines 21b to which reset signals of the G pixels are output are connected to the clamp capacitor 24g.

In the period t22, the clamp pulse φC0R becomes "H", and the input terminal and the output terminal of the differential amplifier 25 are reset to the reference voltage VC0R. Thereafter, when the clamp pulse φC0R becomes "L", the clamp capacitors 24r and 24g clamp the reset signals output to the corresponding vertical output lines 21a and 21b to the reference voltage VC0R, respectively.

In a period t23, the transfer pulses φTX(n) and φTX(n+1) become "H", and the charge accumulated in the PDs 11 in the n-th row and the (n+1)-th row is transferred to the corresponding FDs 13. Thereafter, the transfer pulses φTX(n) and φTX(n+1) become "L", and the unit pixels 10 in the n-th row and the (n+1)-th row output the transferred signals to the corresponding vertical output lines 21a and 21b. The transferred signals are reflected on the vertical output lines 21a and 21b over the settling time as indicated by Vline a and Vline b.

In a period t24, the signal readout circuit 90 reads the transferred signals of the n-th row and the (n+1)-th row from the vertical output lines 21a and 21b. The differential amplifier 25 performs signal amplification according to the signal gains determined by the capacitance ratios of the clamp capacitors 24r and 24g and the gain capacitor 26, and outputs the results to the AD conversion circuits 28. Strictly speaking, since the reset signals are clamped to the reference voltage VC0R by the clamp capacitors 24r and 24g, the differences between the reset signals and the transferred signals are amplified. In addition, as the clamp capacitors 24r and 24g are connected to the differential amplifier 25 at the same time, the transferred signals of the R and G pixels of the n-th row and the (n+1)-th row output to the vertical output lines 21a and 21b are outputted to the AD conversion circuits 28 in a state that signals are added for respective colors. The AD conversion circuits 28 convert the signals input from the differential amplifiers 25 into digital signals and output them to the outside of the image sensor 1. Thereafter, by repeating the same operation as from the period t21, the signals of the unit pixels 10 are sequentially read out.

As described above, by simultaneously connecting a plurality of the vertical output lines 21 to one signal readout circuit 90 and causing the corresponding unit pixels 10 to output signals, the addition readout operation of adding a plurality of output signals becomes possible.

Fourth Embodiment

Next, a fourth embodiment of the present invention will be described. In the fourth embodiment, an example of an image capturing apparatus equipped with the image sensor 1 described in any of the first to third embodiments will be described with reference to FIG. 11.

Figure 11:
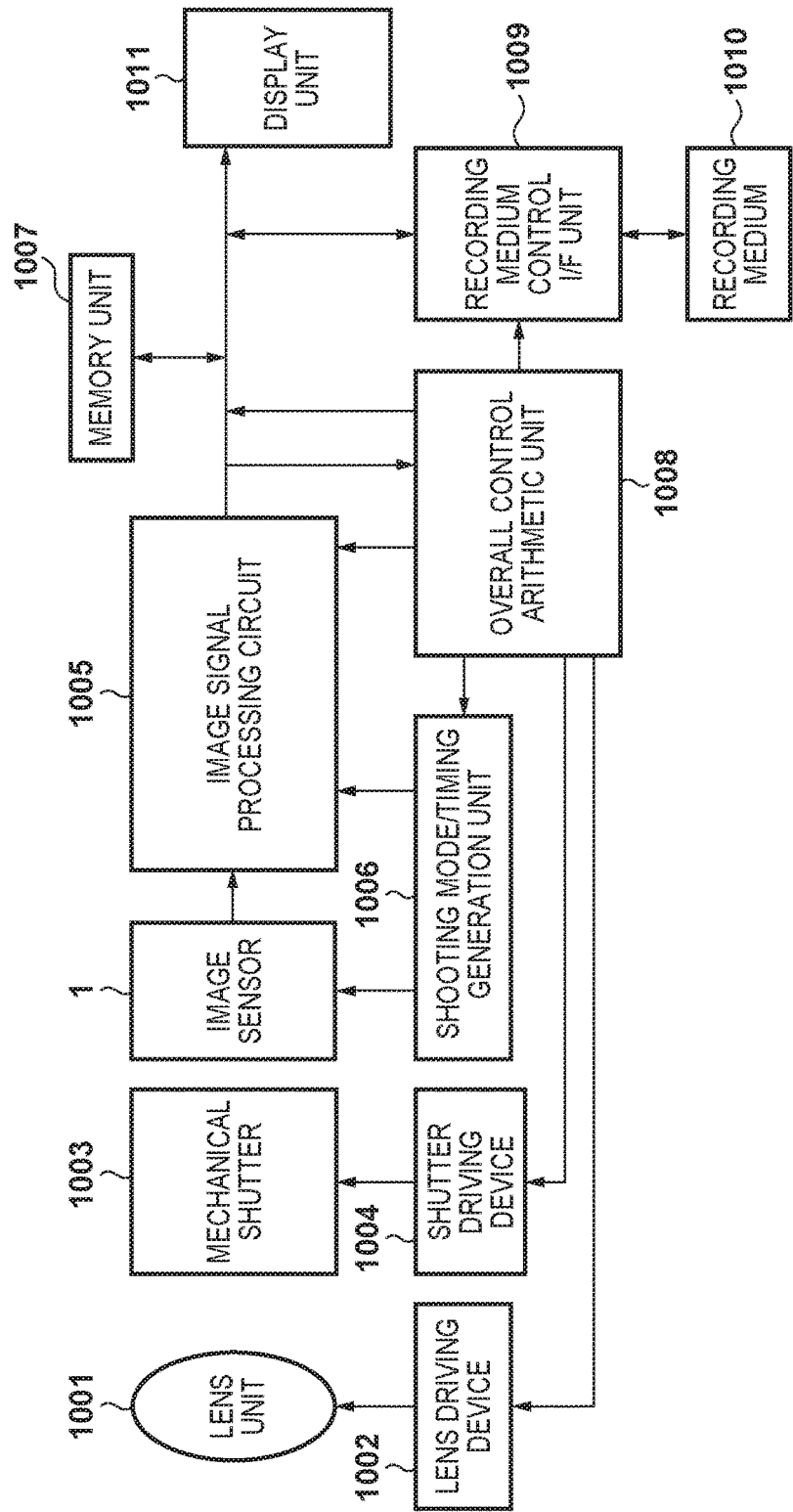
FIG. 11 is a block diagram showing a schematic configuration of an image capturing apparatus according to a fourth embodiment.

In FIG. 11, a lens unit 1001 forms an optical image of a subject on the image sensor 1. Further, zoom control, focus control, aperture control and so forth are performed by a lens driving device 1002.

A mechanical shutter 1003 controls exposure and light shielding of the image sensor 1, and is controlled by a shutter driving device 1004. An image signal processing circuit 1005 performs various corrections and data compression, combining processing of a plurality of images for obtaining a wide dynamic range image, and so forth, on the image signal output from the image sensor 1. A shooting mode/timing generation unit 1006 outputs a shooting mode instruction signal and various timing signals to the image sensor 1 and the image signal processing circuit 1005.

A memory unit 1007 functions as a memory for temporarily storing image data, and an overall control arithmetic unit 1008 is a circuit that performs various arithmetic operations and control of the entire camera system. A recording medium control I/F unit 1009 is an interface for recording or reading on a recording medium, a recording medium 1010 is a removable semiconductor memory for recording or reading out image data, and a display unit 1011 is a device for displaying various information and captured images.

Next, the operation of the digital camera having the above-described configuration at the time of photographing will be described. When the main power supply is turned on, the power supply to the control system is turned on, and then the power supply to a circuit of the image pickup system such as the image signal processing circuit 1005 is turned on. Thereafter, when a release button (not shown) is pressed, an image shooting operation is started.

Upon completion of the image shooting operation, the image signal output from the image sensor 1 is subjected to image processing by the image signal processing circuit 1005, and written into the memory unit 1007 according to an instruction from the overall control arithmetic unit 1008. The data written in the memory unit 1007 is recorded on the removable recording medium 1010 such as a semiconductor memory through the recording medium control I/F unit 1009 under the control of the overall control arithmetic unit 1008. Further, the image may be processed by inputting directly to a computer or the like through an external I/F unit (not shown).

The overall control arithmetic unit 1008 can switch the frame rate and the resolution according to an instruction from an external operation system (not shown). Alternatively, the frame rate and the resolution may be automatically switched according to other image shooting conditions. At that time, in accordance with the switching, the shooting mode/timing generation unit 1006 controls the reading operation of the image sensor 1, such as instructing the image sensor 1 to perform a non-addition readout operation or an addition readout operation.

As described above, by installing the image sensor 1 of any of the first embodiment through the third embodiment in the image capturing apparatus, it is possible to provide a camera capable of shooting images at a higher frame rate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-000710, filed on Jan. 5, 2017 which is hereby incorporated by reference herein in its entirety.

What is claimed is:
1. An image sensor comprising:
   a pixel array in which a plurality of unit pixels are arranged in a matrix;
   a plurality of signal output lines provided for each column of the pixel array;
   a signal readout circuit provided for each column of the pixel array, and having a capacitor capable of selectively connecting to any of the plurality of signal output lines; and
   a control circuit which controls a signal from the unit pixel of each column in a selected first row to be output to any of the plurality of signal output lines, and controls the signal output to the any of the plurality of signal output lines to be input to the signal readout circuit,
   wherein the control circuit controls, for each column, a signal from the unit pixel in a second row that is different from the first row to be output to another of the plurality of signal output lines while the signal output from the unit pixel in the first row to the any of the plurality of signal output lines is being input to the signal readout circuit and stored in the capacitor,
   wherein the unit pixel outputs a reset signal and a transferred signal that is based on transferred charge that corresponds to an incident light,
   wherein the control circuit performs:
      a first control of outputting the reset signal to the signal output line;
      a second control of storing the reset signal output to the signal output line in the first control to the capacitor of the signal readout circuit;
      a third control of outputting the transferred signal to the signal output line; and
      a fourth control of inputting the transferred signal that is output to the signal output line in the third control to the signal readout circuit, reading out the reset signal that is stored in the capacitor, and outputting a difference between the transferred signal and the reset signal from the signal readout circuit, and
   wherein the fourth control on the first row and the first control on the second row are performed in parallel.

2. The image sensor according to claim 1, wherein each of the unit pixels arranged in respective columns of the pixel array is connected to any of the plurality of signal output lines.

3. The image sensor according to claim 1, wherein the control circuit controls, for each column, the signal from the unit pixel in the second row to be output to the other of the plurality of signal output lines while reading out the signal from the unit pixel in the first row from the capacitor and outputting the signal outside of the signal readout circuit.

4. The image sensor according to claim 1, wherein the signal readout circuit has a plurality of capacitor each provided for each of the plurality of signal output lines, and
wherein the control circuit performs a readout operation of reading out the signals to the plurality of signal output lines to the capacitors and a readout operation of reading out the signals from the plurality of capacitors for outputting the signals outside of the signal readout circuit at different timings between the plurality of capacitors.

5. The image sensor according to claim 1, further comprising a first switch for connecting first signal output lines of the plurality of signal output lines of a plurality of adjacent columns, and a second switch for connecting second signal output lines, different from the first signal output lines, of a plurality of adjacent columns,
wherein, in a case where an addition readout operation is designated, the first signal output lines and the second signal output lines are connected respectively by the first and second switches.

6. The image sensor according to claim 5, wherein the pixel array has a first column including a plurality of first unit pixels covered by a filter of a first color and a plurality of second unit pixels covered by a filter of a second color, and a second column including a plurality of third unit pixels covered by a filter of the first color and a plurality of fourth unit pixels covered by a filter of the second color,
wherein the first unit pixels and the third unit pixels are connected to the first signal output lines among the plurality of signal output lines, and the second unit pixels and the fourth unit pixels are connected to the second signal output lines among the plurality of signal output lines, and
wherein the plurality of adjacent columns comprise a plurality of adjacent first columns and a plurality of the adjacent second columns.

7. An image sensor comprising:
a pixel array in which a plurality of unit pixels are arranged in a matrix;
a plurality of signal output lines provided for each column of the pixel array;
a signal readout circuit provided for each column of the pixel array, and having a capacitor capable of selectively connecting to any of the plurality of signal output lines; and
a control circuit which controls a signal from the unit pixel of each column in a selected first row to be output to any of the plurality of signal output lines, and controls the signal output to the any of the plurality of signal output lines to be input to the signal readout circuit,
wherein the control circuit controls, for each column, a signal from the unit pixel in a second row that is different from the first row to be output to another of the plurality of signal output lines while the signal output from the unit pixel in the first row to the any of the plurality of signal output lines is being input to the signal readout circuit and stored in the capacitor,
wherein the unit pixel outputs a reset signal, a transferred signal that is based on transferred charge that corresponds to an incident light,
the control circuit performs:
a first control of outputting the reset signal to the signal output line;
a second control of storing the reset signal output to the signal output line in the first control to the capacitor of the signal readout circuit;
a third control of outputting the transferred signal to the signal output line; and
a fourth control of inputting the transferred signal that is output to the signal output line in the third control to the signal readout circuit, reading out the reset signal that is stored in the capacitor, and outputting a difference between the transferred signal and the reset signal from the signal readout circuit,
wherein the second control on the first row and the first control on the second row are performed in parallel, the third control on the first row and the second control on the second row are performed in parallel, the fourth control on the first row and the third control on the second row are performed in parallel, and the fourth control on the second row and the first control on a third row that is different from the first and second rows are performed in parallel, and
signals from the second row and the third row are output to the different signal output lines from each other.

8. An image capturing apparatus comprising:
an image sensor including:
a pixel array in which a plurality of unit pixels are arranged in a matrix;
a plurality of signal output lines provided for each column of the pixel array;
a signal readout circuit provided for each column of the pixel array, and having a capacitor capable of selectively connecting to any of the plurality of signal output lines; and
a control circuit which controls a signal from the unit pixel of each column in a selected first row to be output to any of the plurality of signal output lines, and controls the signal output to the any of the plurality of signal output lines to be input to the signal readout circuit; and
a processing unit that processes a signal output from the image sensor,
wherein the control circuit controls, for each column, a signal from the unit pixel in a second row that is different from the first row to be output to another of the plurality of signal output lines while the signal output from the unit pixel in the first row to the any of the plurality of signal output lines is being input to the signal readout circuit and stored in the capacitor,
wherein the unit pixel outputs a reset signal and a transferred signal that is based on transferred charge that corresponds to an incident light,
wherein the control circuit performs:
a first control of outputting the reset signal to the signal output line;
a second control of storing the reset signal output to the signal output line in the first control to the capacitor of the signal readout circuit;
a third control of outputting the transferred signal to the signal output line; and a fourth control of inputting the transferred signal that is output to the signal output line in the third control to the signal readout circuit, reading out the reset signal that is stored in the capacitor, and outputting a difference between the transferred signal and the reset signal from the signal readout circuit, and wherein the fourth control on the first row and the first control on the second row are performed in parallel.

9. An image capturing apparatus, comprising:

an image sensor including:
- a pixel array in which a plurality of unit pixels are arranged in a matrix;
- a plurality of signal output lines provided for each column of the pixel array;
- a signal readout circuit provided for each column of the pixel array, and having a capacitor capable of selectively connecting to any of the plurality of signal output lines; and
- a control circuit which controls a signal from the unit pixel of each column in a selected first row to be output to any of the plurality of signal output lines, and controls the signal output to the any of the plurality of signal output lines to be input to the signal readout circuit; and a processing unit that processes a signal output from the image sensor, wherein the control circuit controls, for each column, a signal from the unit pixel in a second row that is different from the first row to be output to another of the plurality of signal output lines while the signal output from the unit pixel in the first row to the any of the plurality of signal output lines is being input to the signal readout circuit and stored in the capacitor, wherein the unit pixel outputs a reset signal, a transferred signal that is based on transferred charge that corresponds to an incident light, and the control circuit performs:
- a first control of outputting the reset signal to the signal output line;
- a second control of storing the reset signal output to the signal output line in the first control to the capacitor of the signal readout circuit;
- a third control of outputting the transferred signal to the signal output line; and
- a fourth control of inputting the transferred signal that is output to the signal output line in the third control to the signal readout circuit, reading out the reset signal that is stored in the capacitor, and outputting a difference between the transferred signal and the reset signal from the signal readout circuit, wherein the second control on the first row and the first control on the second row are performed in parallel, the third control on the first row and the second control on the second row are performed in parallel, the fourth control on the first row and the third control on the second row are performed in parallel, the fourth control on the second row and the first control on a third row that is different from the first and second rows are performed in parallel, and signals from the second row and the third row are output to the different signal output lines from each other.

* * * * *